United States Patent
Bass

(10) Patent No.: US 9,250,634 B2
(45) Date of Patent: Feb. 2, 2016

(54) METHOD OF CONTROLLING A POWER FEED AND APPARATUS

(71) Applicant: HKR SEUFFER AUTOMOTIVE GMBH & CO. KG, Kupferzell (DE)

(72) Inventor: Wolfgang Bass, Bretzfeld-Adolzfurt (DE)

(73) Assignee: HKR SEUFFER AUTOMOTIVE GMBH & CO. KG, Kupferzell (DE)

( * ) Notice: Subject to any disclaimer, the term of this patent is extended or adjusted under 35 U.S.C. 154(b) by 440 days.

(21) Appl. No.: 13/867,190

(22) Filed: Apr. 22, 2013

(65) Prior Publication Data

US 2013/0293033 A1  Nov. 7, 2013

(30) Foreign Application Priority Data

May 4, 2012  (DE) .......................... 10 2012 008 999

(51) Int. Cl.
| | |
|---|---|
| *H02H 5/04* | (2006.01) |
| *G05D 23/19* | (2006.01) |
| *H02P 27/08* | (2006.01) |
| *H02P 29/00* | (2006.01) |
| *H03K 17/08* | (2006.01) |

(52) U.S. Cl.
CPC .......... *G05D 23/1917* (2013.01); *H02P 27/085* (2013.01); *H02P 29/0044* (2013.01); *H02H 5/04* (2013.01); *H02H 5/044* (2013.01); *H03K 2017/0806* (2013.01)

(58) Field of Classification Search
USPC .......................... 307/651; 361/93.7–93.9, 103
See application file for complete search history.

(56) References Cited

U.S. PATENT DOCUMENTS

| | | | | |
|---|---|---|---|---|
| 2009/0262468 | A1* | 10/2009 | Ide .......................... | H01L 23/34 361/18 |
| 2012/0119589 | A1* | 5/2012 | Araki ....................... | H04Q 1/28 307/117 |

FOREIGN PATENT DOCUMENTS

| | | |
|---|---|---|
| CN | 1965241 A | 5/2007 |
| CN | 101498944 A | 8/2009 |
| CN | 101533064 A | 9/2009 |
| DE | 112005001303 T5 | 5/2007 |
| DE | 102007007529 A1 | 8/2007 |
| WO | 2008/098654 A | 8/2008 |
| WO | 2011/057904 A1 | 5/2011 |
| WO | 2011057904 A1 | 5/2011 |

* cited by examiner

*Primary Examiner* — Danny Nguyen
(74) *Attorney, Agent, or Firm* — Ware, Fressola, Maguire & Barber LLP

(57) ABSTRACT

A method of controlling a power feed to a load (L), wherein the load (L) can be connected to an apparatus (1) for the power feed and the power fed to the load (L) has clock-controlled signals. The method includes the steps of: detecting a temperature prevailing in the apparatus (1) by means of at least one temperature sensor (13, 14), providing a first safety function if the detected temperature is not greater than a predetermined first excessive temperature, providing a second safety function if the detected temperature is greater than the predetermined first excessive temperature, and again providing the first safety function if the detected temperature falls and reaches the first excessive temperature, wherein the first safety function includes constant cyclic clock control of the power fed to the load and the second safety function includes temporary cyclic clock control of the power fed to the load.

11 Claims, 5 Drawing Sheets

METHOD OF CONTROLLING A POWER FEED AND APPARATUS

CROSS REFERENCE TO RELATED APPLICATION

This application claims priority under 35 USC §119 to German Patent Application No. 10 2012 008 999.6 filed on May 4, 2012, which application is hereby incorporated by reference in its entirety.

TECHNICAL FIELD

The present invention concerns a method of controlling a power feed to a load, in particular in connection with a service life test, and an apparatus for carrying out the method.

BACKGROUND OF THE INVENTION

Products to be delivered to a customer are generally subjected to a test in regard to operability and durability by a respective manufacturer before delivery. That is particularly important in the case of circuit arrangements with electrical and electronic components, wherein the circuit arrangement can also involve a relatively high degree of complexity and can thus have a large number of different components. Functional testing can therefore be correspondingly complicated and expensive.

In the field of electrical and electronic engineering the individual discrete components as well as integrated circuits are subjected to a detailed test before they are fitted into a device in conjunction with other components or are arranged on a printed circuit board or circuit board (functional assembly). At any event the printed circuit board or the device which is entirely or at least partially finished is to be tested in respect of its function at various stages in manufacture.

That testing operation concerns the general basic function that the circuit arrangement disposed on the printed circuit board (in some cases also a plurality of separate or connected circuit arrangements) must perform. For that purpose actual signals occurring in normal use are applied to the circuit board and, upon evaluation of output signals of the board, it is possible to determine whether the function is performed, in which case it may also be of interest to ascertain the tolerance ranges within which the output signals occur. In such a test, it is based on the usual operating conditions, wherein those operating conditions should also involve the usual prevailing ambient conditions of the respective circuit board in use. The circuit board or products related thereto are delivered only after successful and in part multiple testing.

If it is known that components or circuit boards are used under ambient conditions which lead to an increase loading, such as for example a mechanical loading due to shaking or vibration, or a thermal loading with excessive temperatures, testing is then also necessary to ascertain whether the circuit board or the product connected thereto also performs its function under those extreme ambient conditions and long-term stability can be expected.

For example components and circuit boards arranged in the proximity of a strong heat source are subject to an increase thermal loading which can also give rise to severe fluctuations. Such thermal loadings occur for example in motor vehicles if they are operated in an environment with basically increased temperatures (for example under strong sunlight). Greatly increased temperatures can also briefly occur in an engine compartment of a motor vehicle if for example the internal combustion engine is operated over a prolonged period of time with a high power output in a hot environment and the vehicle has to stop or if a greater amount of power is required at comparatively low engine speeds (and thus with a lower degree of cooling). In that case it is necessary, in connection with a test arrangement for devices to be tested, to implement the corresponding boundary conditions so that checking (testing) can be carried out under the approximately real conditions of a possible increased temperature and also provides information in regard to service life and operability.

A suitable test cycle for testing electrical or electronic components or also a circuit board equipped with such components is determined in dependence on demands and specifications of a customer, in regard to the use of the components or circuit board. In that respect, temperature ranges which are at the edge of the temperature range that occurs in normal operation, in use by the customer, are frequently used for the test. If for example control circuits are considered on a circuit board with corresponding power components and electrolytic capacitors for use in a motor vehicle for the actuation of electric motors for auxiliary modes of operation, then test cycles can be used there, at elevated temperatures of for example 90° C. to 110° C. In that respect, more specifically the circuit boards or also the modular devices are subjected to those changing temperatures in that temperature range and functioning is tested by means of the actuation of corresponding electrical signals and evaluation of the output signals. In that case the output signals which are formed in dependence on the function and the actuation signals in the circuit arrangement to be tested (on the circuit board) are compared to reference or target signals. It is possible to arrive at a conclusion about the operability of the circuit arrangement or circuit board, in dependence on the comparison result.

In the case of a requirement for testing the circuit board at elevated temperatures as are frequently prescribed by customers for the circuit board, the temperature for testing a device, a discrete component or the circuit board is produced in a suitable environment, for example in a test cabinet, in which case the heat produced acts from the exterior on the test piece for example in the form of the circuit board. Temperature detection in the test cabinet and also on the circuit board is required to achieve precise basic data for reliable testing.

If, to simulate real operation, the test piece such as for example the circuit board is actuated with electrical signals, the feed of voltages and currents then produces a corresponding power loss in the device or the circuit board so that this also involves a contribution to the increase in temperature. When determining the temperature of the test piece and its test environment therefore it is necessary to take account of the inherent heat in operation of the test piece (the circuit board).

If the above-specified circuit boards having a circuit arrangement for feeding power to a load, for example to an electric motor of a fan in a motor vehicle, are considered, then besides further requirements there is the need that the circuit arrangement or the circuit board with the corresponding electrical or electronic components must also be operable in a temperature region of 110° C. In that case operable signifies the possibility of feeding a variable power to the connected load like the electric motor in a controlled fashion and thus in connection with a cadence of output signals.

In general service life tests are performed at about 110° C. and concern the properties of the circuit arrangement and the circuit board such as the capability of feeding to a connected load in cyclically controlled fashion, a power which can be controlled or regulated in connection with the cyclic signal cadence. If the circuit arrangement or the circuit board is supplied with corresponding clock signals (for example with pulse width modulated signals or PWM signals) for the controllable or regulatable supply of power to the load and if moreover the situation involves an increased ambient temperature and thus also a circuit board temperature of about 110° C. then interruption of the clock is effected to protect the electrical and electronic components on the circuit board, in which case then to guarantee operation, for example of the load in the form of a fan in the motor vehicle sector, it is actuated at full power.

In that case the power components on the circuit board are completely switched through. The circuit arrangement on the circuit board automatically performs that measure, in which case temperature detection is performed on the circuit board and/or the immediate environment. When the circuit components are completely switched through, in that case there is a lower power loss in respect of the components on the circuit board, irrespective of the maximum power feed to the connected load, so that this entails a lower degree of additional inherent heating as a consequence of the components being completely switched through and the interruption in a clock control. If in operation or also during the testing at the appropriate temperature of about 110° C. that operating condition (ambient conditions) is detected, then for reasons of safety and reliability it is possible to provide for the power components being completely switched on (switched through). That is also justified in view of the high ambient temperature.

That prevents excessive inherent heating of the power components and in particular also the electrolytic capacitors which are subjected to a lower current loading as a consequence of the interruption in the clock control.

If the clock control is interrupted in the limit region of the temperature of about 110° C. and the power components (generally power transistors) are put into the conducting condition and thus switched on, then, on the part of the control circuit formed on the circuit board in question, there is no longer any possibility of controlling or regulating the power of the connected load. Rather, to ensure operation of the load (for example a fan motor) the full power is supplied, so that at least operation of the load is guaranteed, even if the circuit board is in its limit region in regard to its own temperature conditions or the temperature conditions prevailing in the environment.

Thus controllability or regulatability of the power fed to the load is no longer possible by interrupting the clock control, in the temperature limit region of more than 110° C. in conjunction with for example a corresponding test cycle (thermal loading). Rather, after detection of a temperature of more than 110° C. the circuit automatically makes the transition into a simplified mode of operation in accordance with predetermined programming or in conjunction with a control from the exterior, wherein a power which is no longer variable is fed to the load in that simplified mode of operation. In principle complete shut-down is also possible.

Such a behaviour of a circuit arrangement to be tested or a circuit board is shown in FIG. 5. FIG. 5 shows a time-dependent temperature characteristic K (time graph, testing characteristic), as is used in accordance with a known testing procedure. In a comparatively low temperature region of below 110° C., the usual form of actuation of the load connected to the circuit arrangement or circuit board, with clock-controlled signals, is effected between the times t0 and t1, between the times t2 and t3, and from the time t4 (regions A), in which case it is possible to test the operability of the circuit board (circuit arrangement). Thus corresponding clock control of the supplied electrical power (electric signals, output signals) is effected in the regions A in dependence on a power requirement for the load.

In the further time regions which are denoted by B and lie between the times t1 and t2 and between the times t3 and t4, an increased temperature of more than 110° C. occurs, for example a temperature of 120° C. (increased thermal loading). In the regions B, in accordance with the inherent control by the circuit arrangement after detection of the temperature which is occurring or in accordance with control from the exterior, actuation of the connected load with clock-controlled signals no longer occurs as in the regions B the temperature which is increased in any case and which acts on the circuit board from the exterior would entail a danger for the components if inherent heat of the components, for example the electrolytic capacitors and the power transistors, would involve a greater inherent heat (dissipation heat) being added thereto. With an increased temperature range above a predetermined limit temperature therefore the circuit arrangement or the associated circuit board can no longer involve implementation of testing of the controllability or regulatability of the power fed to the load, as a consequence of a necessary interruption in the clock control of the output signals for protecting the components.

SUMMARY OF THE INVENTION

In comparison the object of the invention is to provide a method of controlling the power feed to a load and an associated apparatus for carrying out the method, in such a way that a function of a test piece is ensured in respect of controllability or regulatability of the power to be fed to a load, even in a higher temperature range.

According to the invention that object is attained by a method of controlling a power feed to a load in accordance with the features of claim 1 and by an apparatus for carrying out the method in accordance with the features of claim 10.

The method according to the invention of controlling the power feed to a load includes the following steps: detecting a temperature prevailing in the apparatus by at least one temperature sensor, providing a first safety function if the detected temperature is not greater than a predetermined first excessive temperature, providing a second safety function if the detected temperature is greater than the predetermined first excessive temperature, and again providing the first safety function if the detected temperature falls and reaches the first excessive temperature, wherein the first safety function includes constant cyclic clock control of the power fed to the load and the second safety function includes temporary cyclic clock control of the power fed to the load.

The present invention also concerns an apparatus for carrying out the method.

With the method according to the invention and the associated apparatus therefore it is possible to provide for controllability or regulatability of the power to be fed to a load even in an extreme temperature range and in particular in an elevated temperature range in testing of a circuit arrangement provided on a circuit board. It is at least possible to maintain the control or regulating function during predetermined times so that the basic possibility of the control function or regulating function can be tested in dependence on a detected temperature range. With the control and/or regulating function being temporarily maintained, damage to or destruction of the circuit board in question or the electrical or electronic components arranged thereon is avoided. Rather, the components can be operated with clock-controlled signals in the usual fashion during a predetermined comparatively short duration.

The method of power feed to a load and the associated apparatus therefore take account of the time conditions and the temperature conditions in the environment of the apparatus in such a way that the strategy of a testing procedure can be optimised and at the same time the involved components of the apparatus are protected. It is thus possible at the same time to obtain reliable measurement results in regard to the operability of the circuit arrangement or the apparatus, and it is possible to effectively avoid damage to or destruction of involved components.

In carrying out the method according to the invention by the apparatus measurement values can be achieved in simulated operating conditions, which for example a customer has specified for use of the apparatus in question (circuit arrangement or circuit board) in his load specification. With the apparatus according to the invention and the method therefore the manufacturer, in testing his products (the apparatus), prior to delivery, can easily meet the high and in part changing requirements of a load specification, insofar as the entire function can be tested under realistic and very strict conditions. In that case the apparatus can be designed in the usual implementation with the components for normal operation in a non-elevated temperature range. Stronger components with a higher degree of resistance at full operation and an elevated temperature (that is to say with an elevated thermal loading) are not required.

Further configurations of the present invention are recited in the associated appendant claims.

The second safety function can allow the clock-controlled feed of a power to the load during a feed duration shorter than a duration during which the temperature is higher than the first excessive temperature.

The apparatus can include a circuit board and detection of the prevailing temperature can include detection of the temperature within the apparatus (1) or on the circuit board.

The second safety function can allow a maximum power feed to the load in the duration during which the detected temperature is higher than the first excessive temperature and outside the feed duration.

The second safety function can allow clock control of the power fed to the load at a detected temperature higher than the first excessive temperature, only in the feed duration.

The second safety function can be adapted, at successive times with a detected temperature higher than the first excessive temperature, to change the respective feed duration in dependence on a respective intermediate duration, in respect of its duration.

The second safety function can be adapted, at successive times with a detected temperature higher than the first excessive temperature, to set the feed duration shorter than the respective preceding feed duration if the intermediate duration relative to the preceding duration at a temperature higher than the first excessive temperature is less than a predetermined threshold value.

The second safety function can be adapted at successive times with a detected temperature greater than the first excessive temperature to set the subsequent feed duration longer than the previous feed duration if the interposed intermediate duration is greater than a predetermined further threshold value.

The second safety function at successive times with a detected temperature greater than the first excessive temperature can sum the respective successive feed times and can prevent clock control of the power fed to the load during the subsequent feed times during a duration involving the action of a detected temperature higher than the first excessive temperature if the sum of the feed times reaches a maximum value.

BRIEF DESCRIPTION OF THE DRAWINGS

The invention is described in greater detail hereinafter by means of embodiments by way of example with reference to the drawing in which.

DETAILED DESCRIPTION

The basic structure of a testing arrangement P for testing an apparatus 1 for the control of a power feed to a load L according to the present invention is shown hereinafter with reference to FIG. 1. FIG. 2 shows a block circuit diagram of the apparatus according to the invention which represents a test piece for the testing arrangement P.

Figure 1:
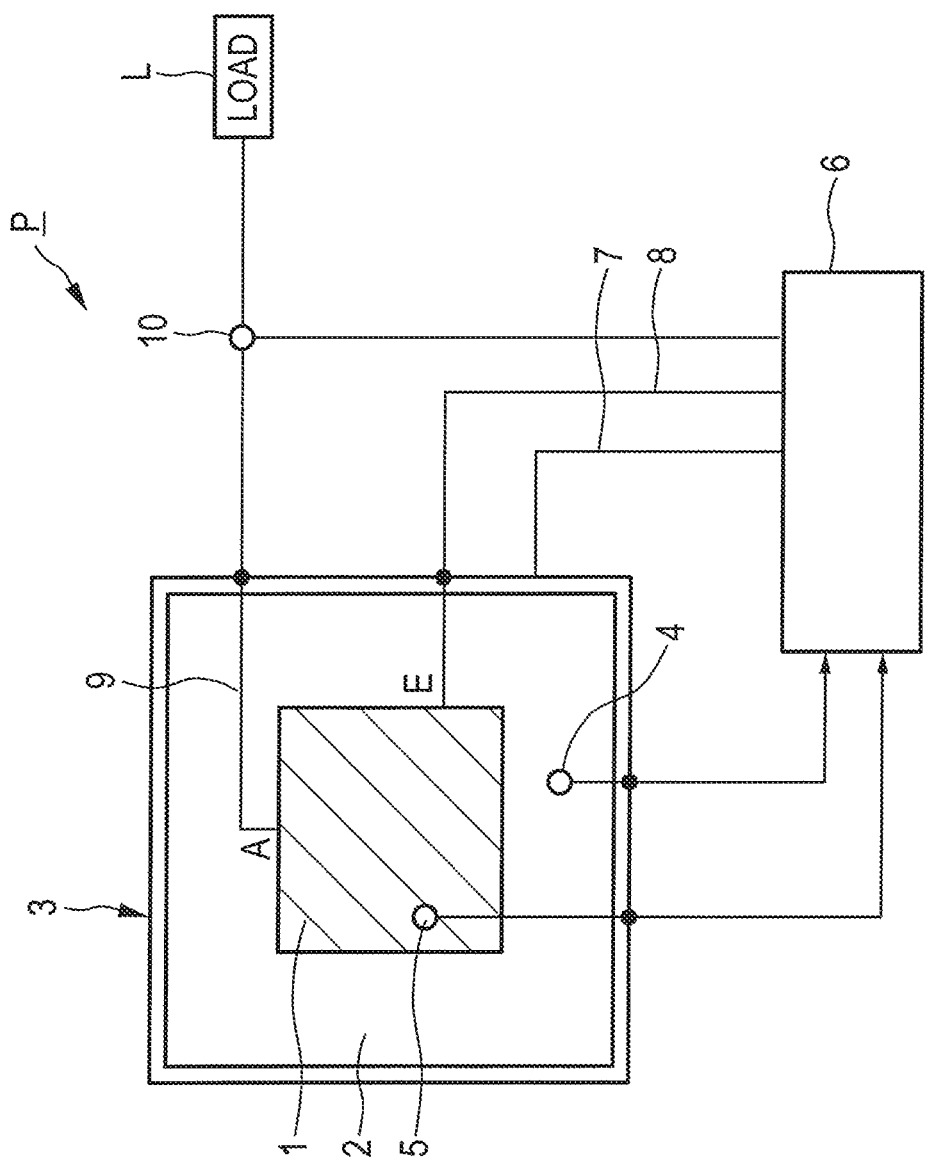
FIG. 1 shows a block circuit diagram to illustrate the arrangement of a test piece of an associated testing environment.
Figure 2:
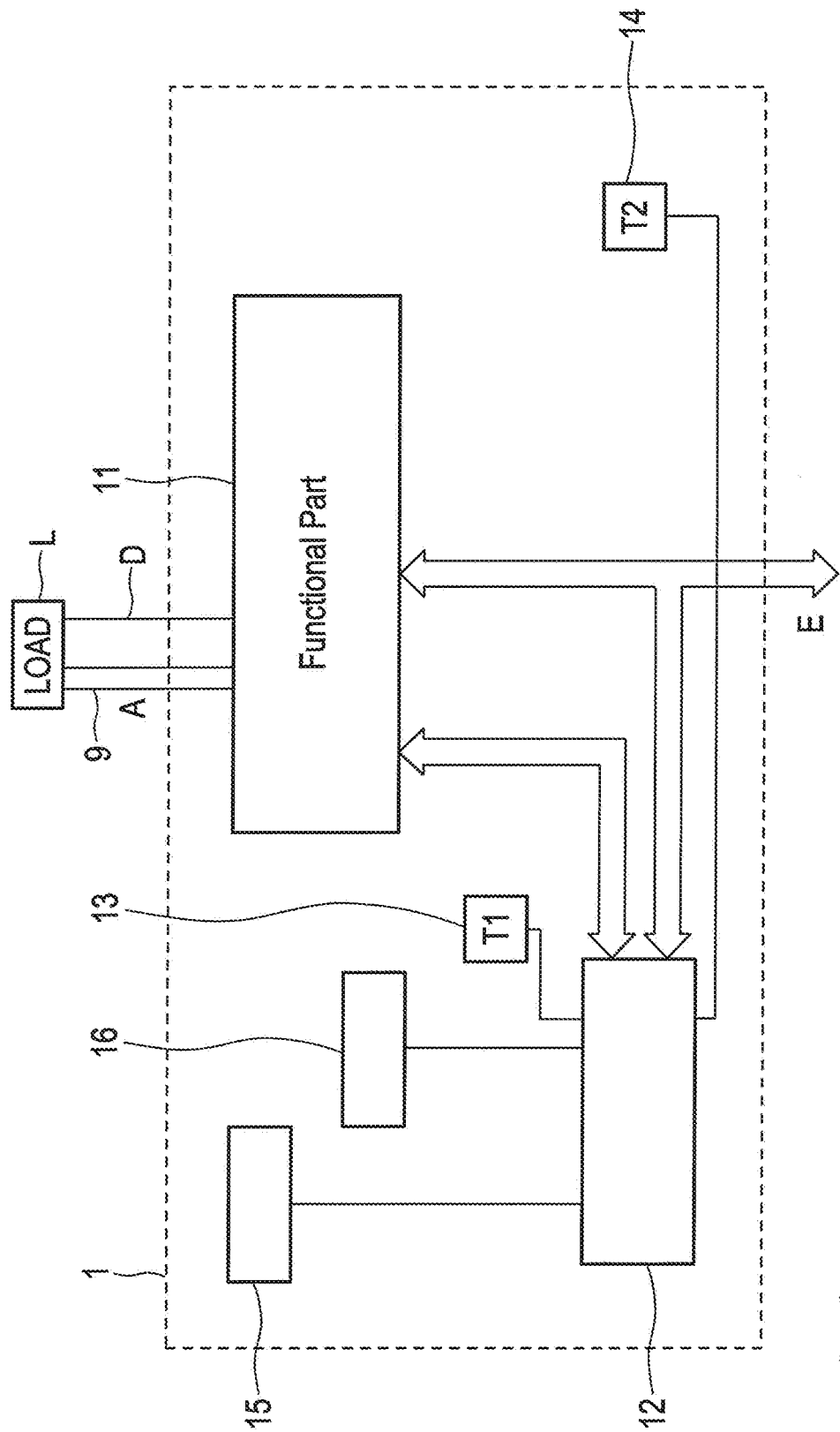
FIG. 2 shows a block circuit diagram of the test piece in the form of the apparatus according to an embodiment of the present invention.

In that respect FIG. 1 in detail shows a block circuit diagram of the various components of the testing arrangement P which forms the testing environment for the apparatus 1. In that respect the apparatus 1 can be in the form of a discrete component, an integrated circuit or a plurality of components arranged on a printed circuit board.

The apparatus 1 which for example is in the form of a circuit board with the circuit arrangement shown in FIG. 2 is arranged in a testing space 2. The testing space 2, for example in the form of a testing housing 3 or an element of cabinet or box form includes devices (not shown in FIG. 1) for affording predetermined climatic conditions and in particular heating devices for heating the testing space 2 to predetermined temperatures. The attainment of a predetermined temperature in the testing space 2 can be detected for example by means of at least one first temperature sensor 4, wherein the at least one first temperature sensor 4 is disposed in a suitable position in the testing space 2 close to the apparatus 1. A plurality of temperature sensors can thus also be provided, in dependence on a different temperature distribution.

The testing arrangement further includes at least one second temperature sensor 5 which is also disposed in the testing space 2 but is arranged directly at the apparatus 1 (the test piece) and thus, by suitable output signals, supplies temperature information directly from the apparatus 1 and thus in the immediate surroundings of the apparatus 1 or even within a housing of the apparatus 1 itself. The output signals of the first and second temperature sensors 4 and 5 are passed to a central control unit 6.

The control unit 6 is adapted to detect required data and to output instructions and actuation signals, by means of which a testing method which is also described hereinafter is performed for testing the apparatus 1 or the test piece.

For that purpose the control unit 6 is connected by way of a first connection 7 to the technical devices of the testing space 2 or the testing housing for actuation of the testing space 2 in regard to the temperature conditions therein. The control unit 6 is also connected to the apparatus 1 by way of a second connection 8, the apparatus 1 having for that purpose an input terminal E. The second connection 8 to the input terminal E of the apparatus 1 serves for providing corresponding input signals (actuation signals) for the apparatus 1 so that it is possible to implement a simulation of an operation, that is as close to reality as possible. Instead of the actuation signals which are supplied in normal operation at the input terminal E, actuation signals are also fed to the apparatus 1 in the testing situation during the testing process. These are suitable electrical parameters such as current and voltage relating to the general power supply of the apparatus 1 as well as control signals for carrying out operation of the apparatus 1. Operation of the apparatus 1 thus includes the controllable or regulatable feed of a suitable power which is dependent on further conditions, to the load L, which is connected at an output terminal A to the apparatus 1 by way of an output connection 9.

The control signals for implementing operation of the apparatus 1 can be clock signals and can also be for example pulse width modification signals (PWM signals). LIN, CAN and the like can also be considered. If such signals and in particular clock-controlled signals are fed to the apparatus 1 for controlling the power feed to the load L, then the apparatus 1 can adjust the power fed to the load L by way of the duty cycle for example of the clock-controlled signals.

The load L is shown as an individual load in the FIG. 1 view. The load L can be for example an electrical or electronic network for receiving the power delivered by the apparatus 1 in constant or controlled fashion by way of the output terminal A, or the load L can also be for example an electric motor which drives a fan and whose power (torque, rotary speed) is controlled or regulated by means of the apparatus 1. In that case use for cooling in a device or for example in a motor vehicle can be considered.

The output signals at the output terminal A of the apparatus 1 are compared in respect of a correct function within the testing process to predetermined correct signals (reference or target signals) to determine whether the apparatus meets the predetermined requirements at least in connection with the provided testing process. To detect the output signals at the output line 9 there is provided a sensor device in the form of a load sensor 10. The output signals of the apparatus 1 are detected by means of the load sensor 10 and a corresponding item of information is fed to the control unit 6, in the form of detection signals.

In accordance with a predetermined testing process specified by a manufacturer or a purchaser of a respective product the control unit 6 feeds predetermined test signals to the apparatus 1 at the input terminal E, and corresponding output signals are expected at the output terminal A for feeding to the load L, in dependence on correct functioning of the apparatus 1. The electric values fed to the load L (current, voltage, pulse duty cycle) are detected by means of the load sensor 10. As a result the control unit 6 receives on the one hand all of the information in respect of the test environment of the apparatus 1 in the testing space 2, and it is further capable of performing time control of the testing process, which is suitable in respect of the signals, in accordance with the intended or required testing process. A user or operator of the entire test arrangement P can monitor and influence the testing process by way of input and output devices (not shown in FIG. 1) like a keyboard and a monitor. In addition the control unit 6 can also be connected to components (not shown in FIG. 1) of a central unit EDP installation such as a host computer or a network. Suitable programs for partially or completely controlling a testing procedure for carrying out a required testing process can be stored in the control unit 6. In addition the control unit 6 provides for setting of the required ambient conditions for the apparatus 1, and in particular the required ambient temperatures which are monitored by means of the first and second temperature sensors 4 and 5 in the testing space 2.

The structure and the function of the apparatus 1 are described hereinafter with reference to FIG. 2.

The apparatus 1 includes a general functional part (referred to hereinafter for simplicity as the functional part) 11, by means of which the function of the apparatus 1 is carried out. More specifically the function of the apparatus 1 essentially provides that, in dependence on instructions inputted at the input terminal E (command or control signals), the connected load L is fed with a predetermined power in the form of suitable voltage and current values and an associated clock control (for example by means of pulse width modulated signals) so that a desired operating condition of the load L and thus a desired power delivery is achieved. In particular for example the load L can comprise a heating device, in which case the heating power of the load L is adjusted and thus controlled or also under predetermined conditions it is regulated. If for example the load L is in the form of an electric motor for driving a fan then a rotary speed and thus a volume of air to be delivered is adjusted therewith, with the set power in accordance with the control signals fed at the input terminal E.

The general functional part 11 thus includes suitable power components, by means of which the respective variable power to be fed to the load L can be adjusted. The control signals fed to the input terminal E from the exterior therefore also include clock information such as for example PWM signals.

The corresponding power to be fed is delivered by the apparatus 1 at its output terminal A. A diagnostic line D serves to feed the apparatus 1 with information in respect of the operating performance of the load L.

These can be operating values or also fault information about malfunctions, such as for example in regard to a jammed fan.

The apparatus 1 further includes a control device 12 which is provided to influence the general functional part 11 of the apparatus 1 under predetermined conditions in such a way that the apparatus 1 adopts a predetermined behaviour in dependence on detected temperatures. In particular protective measures are implemented in dependence on predetermined conditions if for example temperatures rise above associated threshold values. For that purpose the control device 12 is connected to a first temperature sensor (T1) 13 which detects the respective temperature at a given location in the apparatus 1. The control device 12 is further connected to a second temperature sensor (T2) 14 which detects the temperature within the apparatus 1 at a different location from the first temperature sensor 13. The respective temperature information is fed to the control device in the form of suitable electric signals.

If it is assumed that the apparatus 1 is in the form of a printed circuit board then the first and second temperature sensors 13 and 14 are arranged on the circuit board at various locations. The invention is also not restricted to the first and second temperature sensors 13 and 14. It is sufficient if there is at least one temperature sensor 13 which provides for temperature detection at a central location. The present invention is also not restricted to two temperature sensors. Further temperature sensors are possible.

The control device 12 is also connected to a timing device (timer) which is adapted to provide time information and in particular is adapted to deliver corresponding information in the form of time-controlled electric signals in respect of predetermined moments in time and predetermined times in respect of the duration thereof.

The control device 12 is further connected to a storage member 16 in which data and program are stored and detection results and fresh acquired data can be stored.

At least one of the two temperature sensors 13 and 14 can also be arranged in the general functional part and in particular at affected power components which in operation generate an increased level of dissipation heat. These are for example power semiconductors in the form of transistors (MOSFETs) and electrolytic capacitors which in particular when processing clocked signals, due to continuous recharging currents, have an increased power loss and thus an increased temperature.

The mode of operation and the function of the apparatus 1 for controlling the feed of power to a load L is described hereinafter with reference to FIG. 3.

Figure 3:
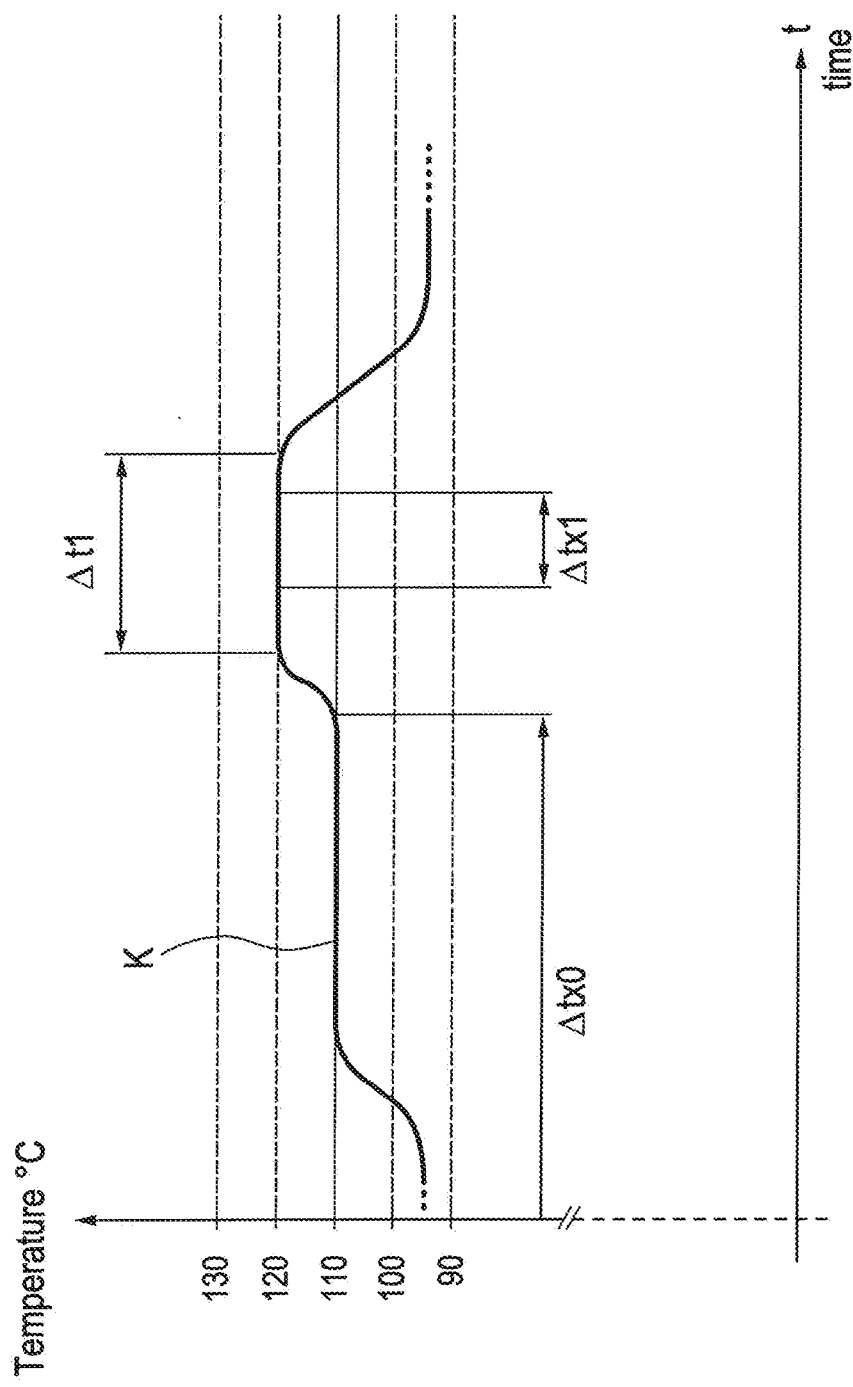
FIG. 3 shows a temperature time configuration of a testing characteristic to illustrate a method according to the present invention.

FIG. 3 shows a characteristic curve K in the form of a temperature-time configuration which illustrates for example a testing process to which the apparatus 1 according to the invention (test piece) can be subjected. The characteristic curve K thus represents a test curve or also a temperature curve.

The basis of the testing process is that the test piece in the form of the apparatus 1 is disposed in the testing space 2 and all electric connections are made. The (central) control unit 6 (FIG. 1) is in that case in a position to provide in the testing space 2 the appropriate test conditions such as for example a predetermined temperature and to actuate a heating device (not shown in the Figures) in the testing space 2. The temperature in the testing space 2 at different locations can be detected in accordance with the foregoing description by the two temperature sensors 4 and 5. The apparatus 1 is fed with the required currents, voltages and signals at the input terminal E to perform the testing process and they are taken off by means of the load sensor 10 for evaluation purposes at the output terminal A.

If the apparatus is to be subjected to a functional test in which elevated temperatures are also taken into account then the control unit 6 causes an increase in the temperature in the testing space 2 with a temperature-time configuration corresponding to the temperature curve K in the FIG. 3 view. The testing space 2 is heated and therewith also the apparatus 1.

If the apparatus 1 receives corresponding actuation signals for feeding a predetermined power to the load L then they are for example clock signals or clock-controlled signals such as PWM signals, wherein the power fed to the load L is also clock-controlled and thus adjusted.

In accordance with the view shown in FIG. 3 for example the temperature in the testing space 2 is increased from a lower starting temperature to about 110° C. If for example it is assumed that the apparatus 1 is a control device for the actuation of an electric motor of a fan in a motor vehicle then increased temperatures can occur in the motor vehicle due to operation thereof or due to climatic influences. In that respect a mode of operation corresponding to real use is simulated.

The temperature of the testing space 2 is increased in accordance with the test characteristic curve in conjunction with a predetermined test program which is implemented by the control unit 6 to a first excessive temperature which is in a region of between about 100° C. and 110° C. and which can be for example about 110° C. At that first excessive temperature the apparatus 1 is actuated with signals corresponding to a real mode of operation, wherein preferably clock-controlled signals are supplied so that the apparatus 1 is capable of feeding the load L with a power level in controlled fashion by way of the output line 9. The apparatus 1 is thus operated in a clock-controlled fashion. That can be effected within the duration $\Delta tx0$ (feed duration) which is specified in FIG. 3. This concerns a temperature range of lower temperatures to about 110° C.

A usual clock-controlled signal can be supplied in the duration $\Delta tx0$ in the context of the testing procedure or a test of the apparatus 1. This can be dependent on the further requirements of a predetermined test cycle or other test provisions such as for example of the manufacturer or a user of the apparatus 1. The increased power loss linked to clock control of the signals within the apparatus 1, in individual components of the apparatus 1, can be dissipated up to a temperature of about 110° C. without that resulting in damage to the components in question or inadmissible ageing.

If as shown in FIG. 3 the temperature of the temperature characteristic curve K is further increased in the context of the testing process and if for example a second excessive temperature of about 120° C. is reached, which is thus above the first excessive temperature, then, with the feed of corresponding signals and in particular clock-controlled signals by the control unit 6, there is the danger that local heating occurs in the apparatus (for example on a circuit board) and specifically individual components can assume an undesirably high temperature so that more severe ageing or even damage occurs. The undesirably high temperature generally occurs in connection with clock-controlled signals as in that case, especially in respect of electrolytic capacitors, charging and discharging currents occur and thus the power loss of the individual components can heat the individual component, in addition to an elevated ambient temperature. This can therefore lead to local excessive and even inadmissible heating and consequently a considerably reduced service life for the components involved.

In this connection the apparatus includes a first safety function or safety measure in which, as a basis, the temperature within the apparatus 1 is detected by means of the temperature sensors 13 and 14. If the control device 12, in conjunction with the two temperature sensors 13 and 14, detects temperatures which are lower than or equal to the first excessive temperature of about 110° C., then normal operation with clock-controlled signals is possible, in which case in a test mode clock-controlled signals are also processed or permitted by the apparatus 1 so that clock-controlled signals corresponding to actuation by the control unit 6 can be processed or permitted both in usual use of the apparatus 1 and also in the test mode (test cycle), in the temperature range lower than or equal to the first excessive temperature. Accordingly the first safety function or safety measure permits the processing of clock-controlled signals at temperatures lower than or equal to the first excessive temperature.

If however the first excessive temperature is exceeded and that is detected by means of the temperature sensors 13 and 14 then the first safety function provides that the processing of clock-controlled signals is interrupted to avoid an increased power loss and either the full power is fed to the load L (power components and electrolytic capacitors are completely switched through), or complete shut-down is implemented. If therefore a temperature which is above the first excessive temperature is detected then, in connection with the first safety function, clock control of the feed of power to the load L is interrupted or no longer enabled, in which case however controllability or regulatability of the power fed to the load L is not possible. While therefore, in connection with the first safety function of the apparatus 1, a long-term mode of operation is possible in dependence on instructions from the exterior specifically for operation of the load L with a clock control of the signals, clock control of the signals is prevented upon attainment of the first excessive temperature to reduce the power loss in individual components.

If for example in accordance with the test cycle shown in FIG. 3, in connection with the temperature curve K during the time duration $\Delta t1$, an elevated temperature of for example 120° C. corresponding to the second excessive temperature is reached, then clock control is interrupted during the period $\Delta t1$, in connection with the first safety function.

In this connection the apparatus 1 has a second safety function which is described in detail hereinafter with renewed reference to FIG. 3.

In the test cycle shown in FIG. 3 for example within the period $\Delta t1$ there is a temperature approximately in the region of the second excessive temperature (of about 120° C.). That can also correspond to real conditions in use of the apparatus 1. In the apparatus, the first safety function would interrupt the clock control of the power to be fed to the load L, and would feed the full power to the load L upon a corresponding operational demand by the control unit 6.

In accordance with the second safety device, it is possible under predetermined conditions for clock control of the power fed to the load L to be permitted even when the first excessive temperature is exceeded and the second excessive temperature is reached. The second safety function is of such a nature that both protection of the components and also fundamental clock control in that temperature region above the first excessive temperature and for example in the region of the second excessive temperature is possible, but that clock control of the signals within the apparatus 1 is permitted only for a short time. After the occurrence of the elevated excessive temperature was detected in the apparatus 1, for example in the region of the second excessive temperature, clock control of the output signals of the apparatus 1 is effected during the period $\Delta t1$ in which for example the second excessive temperature lasts, only for a predetermined shorter time duration $\Delta tx1$, wherein that duration is less than the duration $\Delta t1$, but is within the duration $\Delta t1$.

The second safety function causes such a control of the functional part 11 of the apparatus 1, that, within the time duration $\Delta t1$ at the elevated temperature, basically the maximum power feed to the load L is completely switched through (first safety function), but for a short predetermined time duration $\Delta tx1$ (that is to say temporarily), clock control of the signals is possible or permitted. In that case the second safety function is temporarily superposed on the first safety function so that both in the usual region of use of the apparatus 1 or in a test mode, for a predetermined shorter period of time (short-term mode of operation), processing of clock-controlled signals is permitted so that on the one hand in the feed of power to the load L controllability or regulatability is afforded while on the other hand during a test cycle (testing process) the operability (function) of the apparatus 1 can be checked, in regard to processing of the clock-controlled signals.

Irrespective of the duration of the elevated temperature during the time $\Delta t1$ above the first excessive temperature the time duration $\Delta tx1 < \Delta t1$ is sized in a predetermined fashion so that excessive heating of the components involved can be avoided. After the end of the feed duration $\Delta tx1$ the function of the apparatus 1 goes back into the completely switched-through mode of operation in accordance with control by the control device 12, until the temperature within the apparatus 1 shows that at least the first excessive temperature or a lower temperature are attained. The function of the apparatus thus transitions from the second (temporary) safety function back to the first safety function which is suitable for long-term operation. In this case clock control of the output signals for the controlled or regulated feed of power to the load L can be permitted again by the apparatus in accordance with the first safety function. That then depends on the control signals supplied from the exterior.

With the implementation of the second safety function there is the possibility of performing a test of the apparatus 1 at a further excessively increased excessive temperature, and in the present case at the second excessive temperature in the region of about 120° C. which is higher than the first excessive temperature which can be a limit temperature in the region of about 110° C. for the usual feed of clock-controlled signals. During the action of the second excessive temperature, the feed of clock-controlled signals can be permitted at least for the predetermined time duration $\Delta tx1$ which is shorter than the time duration $\Delta t1$ from which the second excessive temperature acts on the apparatus 1. In that way it is possible to obtain complete test results by testing all functions of the apparatus 1 even in that extreme temperature range with a mode of actuation which is close to reality. At the same time this avoids the components involved such as power semiconductors or electrolytic capacitors being excessively loaded and stressed. As a consequence of the greater thermal loading of the components involved only for a predetermined shorter period of time (for example the time duration $\Delta tx1$ shown in FIG. 3), there is no need for cooling measures to be further taken or for stronger components which are therefore also larger in respect of their mechanical dimensions to be used in the apparatus 1 (for example on a circuit board). With the provision of the first and superposed second safety functions according to the invention for the apparatus 1 it is therefore possible to forego the use of stronger and larger components.

It is further possible, upon the occurrence of the second excessive temperature and the short-term permitted clock control of the signals for the feed of power to the load L, to vary those short times in accordance with further conditions in respect of the apparatus 1 in question, within certain limits, or to cumulate the various times of clock control of the signals while the second excessive temperature is acting on the apparatus and to define corresponding limit values in respect of the cumulated times, which may not be exceeded. When such limit values are reached or in the case of further problems the system undergoes a transition to the condition of being completely switched through, in the sense of the first safety function in connection with the first excessive temperature, or complete shut-down in the event of further detrimental conditions.

Thus, for the sum of all times $\Delta tx1$ in successive times at elevated temperature in the region of the second excessive temperature and in the meantime with a corresponding reduction in temperature, it is possible to define a maximum time representing a limit value for the cumulated times $\Delta tx1$ in each case during the also cumulated times of the elevated temperature $\Delta t1$.

Figure 4:
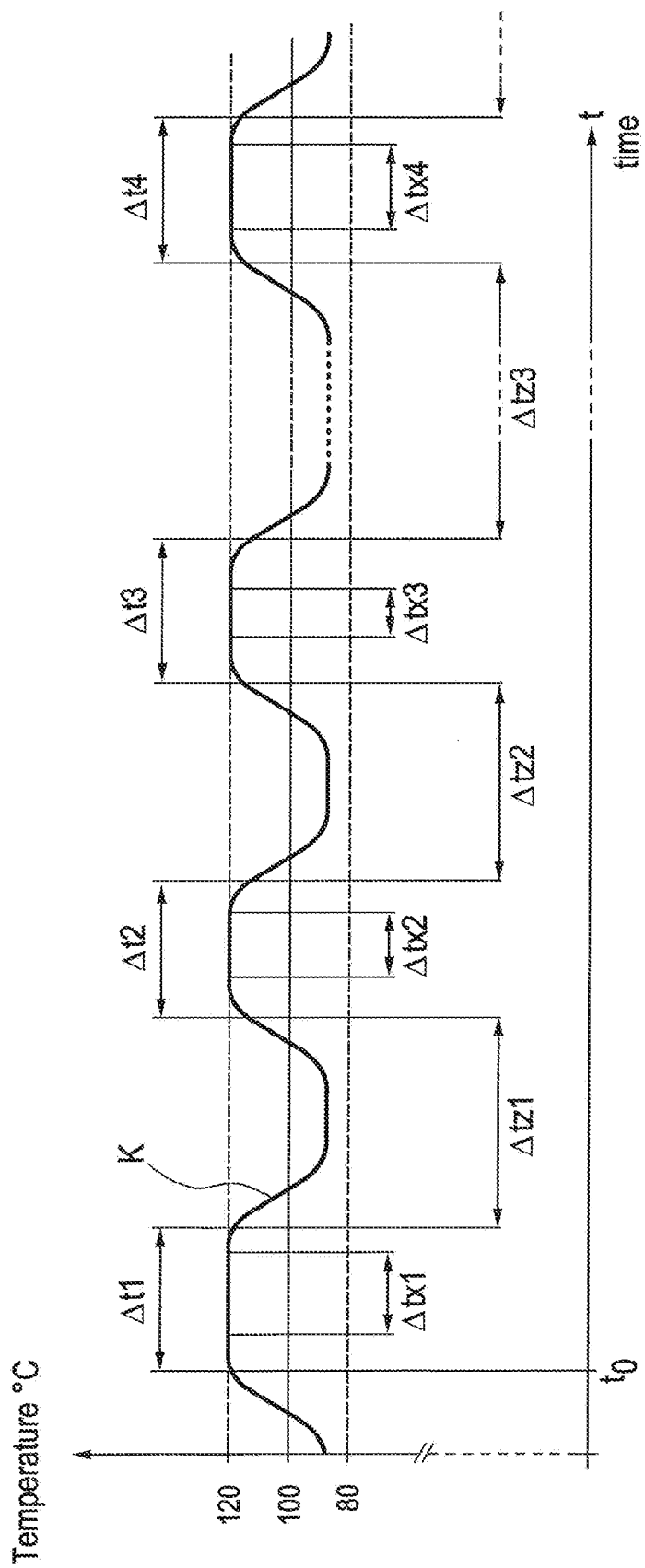
FIG. 4 shows a temperature time configuration of a further testing characteristic to illustrate the method according to the present invention with a plurality of times in respect of the occurrence of a second excessive temperature.
Figure 5:
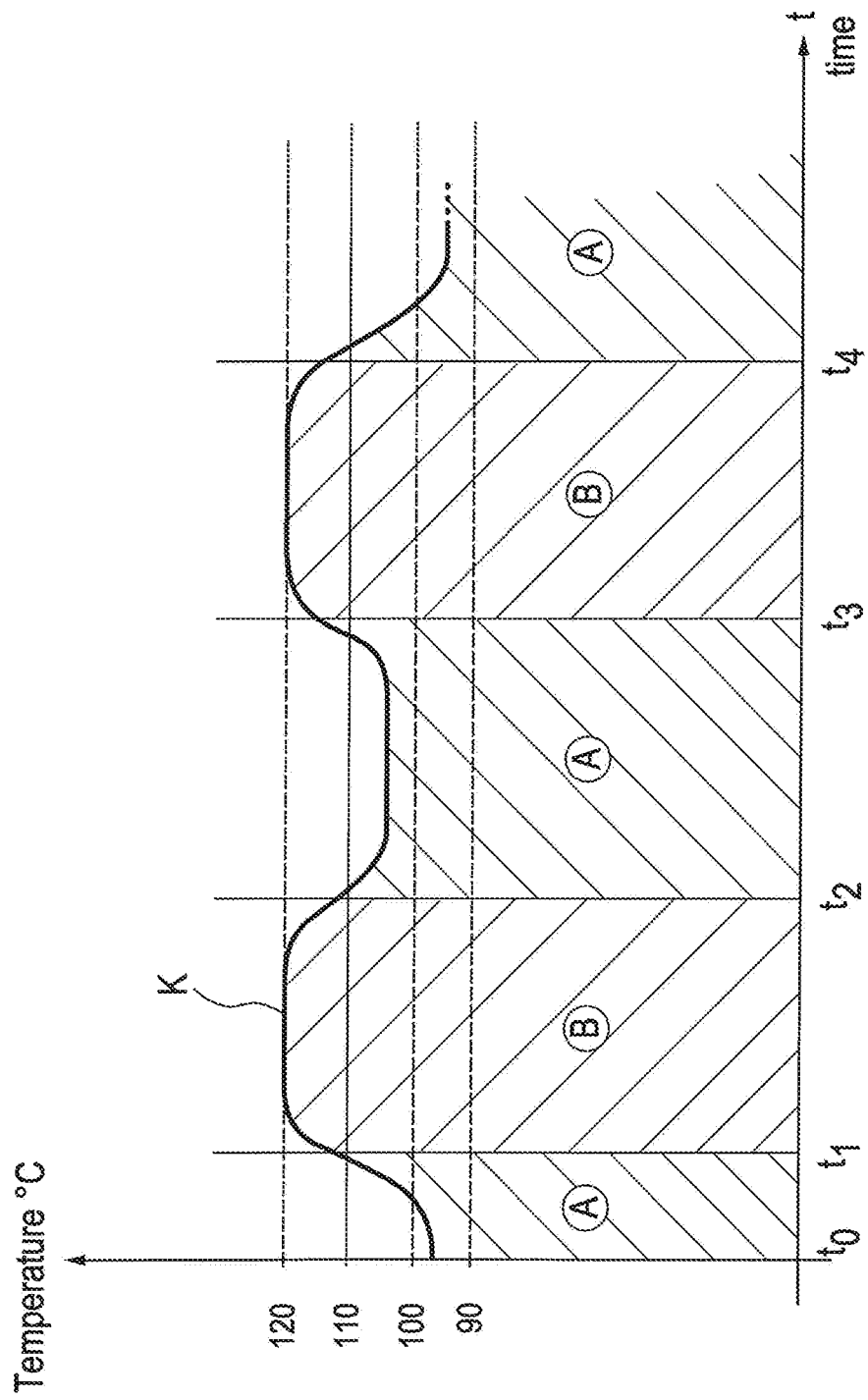
FIG. 5 shows a temperature time configuration of a testing characteristic to illustrate a testing method with a test piece according to the state of the art.

In that respect FIG. 4 shows a further alternative configuration for example of a test cycle for the apparatus 1, wherein the temperature characteristic K as shown in FIG. 4 has a plurality of regions involving an elevated temperature loading according to the second excessive temperature (of for example about 120° C.). The present invention with the alternative configuration for the temperature characteristic K is illustrated for example at 4 regions involving an elevated temperature. In this case, corresponding to the view in FIG. 4, the duration for which a feed of clock-controlled actuation signals to the load L is effected during the action of the second excessive temperature and thus processing of clock-controlled signals is effected or is permitted by the apparatus 1, is influenced in dependence on a (substantially thermal) past history of the apparatus 1 if at a given time during the entire testing process or also during real operation of the apparatus 1 in the use thereof after a temperature drop a temperature rise is again achieved to for example the second excessive temperature. The respective temperatures are detected by means of the temperature sensors 13 and 14 as shown in FIG. 2 and monitored in connection with the control device 12 and the first and second safety functions are controlled on the basis of the detected temperatures. The reaction of the apparatus 1 in accordance with the view shown in FIG. 4 therefore takes account of the influences of thermal inertia of the apparatus or individual components as well as the past history of the immediately preceding operational situations and in particular the operational ranges involving predetermined temperatures.

The mode of operation of the apparatus 1 can be illustrated by means of the testing procedure (test cycle) shown in FIG. 4. After an initial value for a temperature in the region between 80° C. and 100° C., the temperature is increased at a time t0 to a second excessive temperature which also represents a limit temperature. The action of the second excessive temperature on the apparatus 1 lasts for the first time duration $\Delta t1$. After expiry of the first time duration $\Delta t1$ the temperature again falls as shown by the temperature characteristic K below the second excessive temperature and for example can also fall below the first excessive temperature (which can be about 110° C.).

During the action of the second excessive temperature in the first time duration $\Delta t1$ clock-controlled signals are temporarily fed to the load L during the shorter time duration $\Delta tx1$ (the first feed duration) by the apparatus 1 in connection with a control by the control device 12 so that the clock control and thus the overall function can be permitted and thus checked during that time duration. After the end of the first feed time duration $\Delta tx1$ the arrangement is completely switched through and that can be maintained if then the temperature falls again below the second excessive temperature or it is possible to change over to the first safety function.

If after a first intermediate time $\Delta tz1$ (time interval between times at an elevated temperature) the temperature rises again to the second excessive temperature and if the action of the second excessive temperature on the apparatus lasts for the second time duration $\Delta t2$, then within the second time duration $\Delta t2$, in a shorter second feed time duration $\Delta tx2$, clock-controlled signals are fed to the connected load L by the second safety function of the apparatus 1. In the other times, if this is necessary, the power components are completely switched through and this gives maximum feed of power to the load L, in accordance with control signals which are supplied from the exterior.

Thereafter there follows a second intermediate time duration $\Delta tz2$ during which the temperature falls again in order thereafter to rise again to the second excessive temperature. That is then maintained during the third time duration $\Delta t3$ and, within the third time duration $\Delta t3$, clock-controlled signals are fed to the load L by the apparatus 1 during the shorter time duration $\Delta tx3$.

A plurality of changes with rising and falling temperature in accordance with the temperature curve K are specified until the third time duration $\Delta t3$ occurs. As a consequence of the further rise to the second excessive temperature, which follows in succession in a relatively short time, and an assumed lesser degree of cooling in the intermediate times (time intervals), the corresponding times of the feed of clock-controlled signals to the load (times $\Delta tx1$, $\Delta tx2$ and $\Delta tx3$) are correspondingly varied so that the first feed time duration $\Delta tx1$ is longer than the second feed time duration $\Delta tx2$, and that in turn is longer than the third feed time duration $\Delta tx3$. Accordingly $\Delta tx1 > \Delta tx2 > \Delta tx3$ applies.

At successive times $\Delta t1$, $\Delta t2$ and $\Delta t3$ with a detected temperature higher than the first excessive temperature, therefore (as shown in FIG. 4), in conjunction with the second safety function, the corresponding feed time duration, for example $\Delta tx2$, can be set to be shorter than the respectively preceding feed time duration (for example $\Delta tx1$) if the one intermediate time duration (for example $\Delta tz1$) in relation to the preceding time duration $\Delta t2$ involving a temperature higher than the first excessive temperature is less than a predetermined threshold value. It is thus possible to compare the respective intermediate times with predetermined threshold values (which are also variable).

In addition, in connection with the second safety function, at successive times $\Delta t1$, $\Delta t2$, . . . involving a detected temperature higher than the first excessive temperature, the subsequent feed time duration $\Delta tx4$ can be set to be longer than the previous feed time duration $\Delta tx3$ if the interposed intermediate time duration $\Delta tz3$ is greater than a predetermined further threshold value.

That avoids excessive heating occurring in the case of closely successive times for which the second excessive temperature acts on the apparatus, in cumulated times involving the feed of clock-controlled signals to the load L. Therefore the second safety function in accordance with the alternative embodiment of FIG. 4 also takes account of the (at least thermal) past history of the apparatus 1.

If, after expiry of the third time duration $\Delta t3$, the temperature again falls below the second excessive temperature for a longer third intermediate time duration $\Delta tz3$ and then rises again to be maintained for a fourth time duration $\Delta t4$ and to act on the apparatus 1, it is then possible, as a consequence of a cooling action to be expected in the somewhat longer third intermediate time duration $\Delta tz3$, to select a fourth feed time duration $\Delta tx4$ as being longer again than the previous third feed time duration $\Delta tx3$ so that in this case the fourth feed time duration $\Delta tx4$ is greater than the somewhat longer previous third feed time duration $\Delta tx3$.

The corresponding times and moments in time are controlled in connection with the timer 15 of the apparatus 1, in which case a corresponding time presetting is communicated to the control device 12 for implementing the first and second safety functions. It is thus possible, even with a close succession of times involving an elevated temperature acting on the apparatus 1 in the region of the second excessive temperature, it is possible to prevent excessive heating of the components involved, but at the same time it is possible to achieve maximum possible testing information upon simulation of a real mode of operation with clock-controlled signals. The apparatus 1 can also at least temporarily implement a controlled feed of power to the load L in connection with the first safety function and the second safety function as shown in FIG. 4 at changing temperatures occurring in use in dependence on the control signals supplied from the exterior. It is therefore possible to achieve effective and efficient as well as also complete testing of the apparatus 1 which is for example in the form of a circuit board, and in addition, during a mode of operation with changing temperatures in the proximity of the limit temperatures, this gives enhanced safety from unwanted heating or damage to components involved. In particular the components which are generally particularly adversely affected like electrolytic capacitors and power semiconductors can be protected from excessive ageing, in which case testing is made possible as a consequence of permitting clock control, which is only for a short time in a situation involving the action of an elevated excessive temperature, and controlled power can also be at least temporarily fed to the load L in that region.

In the above-described example, as a consequence of the time ratios of the intermediate times $\Delta tz1$ and $\Delta tz2$, the feed times are so selected that the following applies: $\Delta tx3<\Delta tx2<\Delta tx1$. Other conditions apply for the fourth feed time duration $\Delta tx4$, due to the longer intermediate time duration $\Delta tz3$.

Effective prevention of inadmissible heating of individual components like for example the electrolytic capacitors or power semiconductors has the result that components of a given size and strength can be used as the heating action due to the feed of the required clock-controlled signals does not exceed a predetermined level only for a relatively short period of time which is shorter than the period for which the elevated excessive temperature acts. There is therefore no need for the entire circuit arrangement of the apparatus 1 and in particular the relevant components to be designed for permanent operation at the second excessive temperature with the continuous clock control of the signals so that the costs of the apparatus 1 (for example in the form of a circuit board) can be reduced. During a multi-part test cycle with a close succession of times at an elevated temperature in accordance with the second excessive temperature, there is also the possibility of totalling those times and determining a maximum time in respect of the feed times during the occurrence of the second excessive temperature. That would correspond to cumulation for example of the feed times $\Delta tx1$, $\Delta tx2$ and $\Delta tx3$ during a predetermined time duration and the definition of a maximum value which may not be exceeded. If that is achieved then the clock control is interrupted and, in dependence on the control signals supplied from the exterior, the circuit arrangement is completely switched through to avoid an elevated level of power loss in the apparatus 1.

The advantages of the present invention can also be achieved if the operating conditions of the load L are also detected in connection with temperature detection by means of the temperature sensors 13 and 14, within the apparatus, and are incorporated into the control or regulating concept. For that purpose the apparatus 1 has the diagnostic line D, already mentioned in relation to FIG. 2, between the load L and the apparatus 1. In particular the diagnostic line D makes a connection between the load L and the functional part 11 of the apparatus 1. Operating information in respect of operation of the load can be communicated to the functional part 11 by means of the diagnostic line D.

The operating information includes operating conditions like the temperature of the load, for example a fan motor, current consumption (in connection with current measurement), if necessary also a rotary speed of the fan motor, and fault conditions in relation to an excessive temperature or an excessive current if the load L which for example is in the form of the fan motor is prevented from rotating or rotation is impeded. That can occur for example as a result of a defective bearing in a drive motor or a brake or blocking of the fan wheel. Corresponding electric values in analog or digital form are fed to the apparatus 1 (functional part 11). There is therefore the possibility, depending on the need involved, to monitor the entire operation of the feed of power to the load L as well as the actual operation of the load L by means of the apparatus 1 during the feed of power by the apparatus 1. Detection devices required for that purpose are arranged at the load L or in the direct environment thereof, but are not shown in the Figures to simplify the views therein.

In the same way as in the foregoing description there is the possible option of determining a first temperature range which represents a low temperature range and can include for example a range of between −40° and +110°. A temperature range of that kind is typical for use of the load L, for example a fan motor, in a motor vehicle. In that first temperature range involving a temperature ≤110° C. monitoring of the load L is continuously effected by way of the diagnostic line D and the apparatus 1 can be operated for example in an overload condition in which a higher current than a nominal current can be fed to the load if that is required, for example upon a defect with the load L and in particular with a fan or fan motor which is running with difficulty. The nominal current or nominal power can here respectively represent a maximum value of the current or the power feed to the load L if normal and thus fault-free or disturbance-free operation is occurring, in connection with continuous or cyclic monitoring of the load L.

In this case the increased power can also be fed to the load at times with clock-controlled signals in conjunction with the overload condition of the apparatus 1 in the corresponding manner as shown in FIGS. 3 and 4. The feed times involving an increased power (overload condition) in comparison with a power related to the nominal current occurs in that respect during the times in which the temperature of the apparatus is lower than or equal to the upper limit of the first (lower) temperature range. This means that clock control in those times is also possible if required to maintain a control or regulating function and/or an elevated current greater than the nominal current can be fed to the load L. The apparatus 1 can be operated with overload in that temperature range.

Besides an increase loading on the electrolytic capacitors the power components (power semiconductors) are also exposed to a higher thermal loading, in particular in connection with a clock control for the signals, at an elevated current greater than the nominal current. In the lower first temperature range a predetermined overload, that is to say a predetermined overcurrent greater than the nominal current, can be permitted, in which respect it is assumed that the heat generated can be dissipated both in the electrolytic capacitors and also in the power semiconductors. Thus for the permissible overcurrent or for a corresponding increased power, it is possible to define a first parameter set with tolerances within which the electric values can respectively range without having to provide that the components in the apparatus 1 are completely switched through to avoid damage.

If there is a second temperature range with an elevated temperature higher than for example 110° C. in the apparatus 1 it is then necessary to provide for a limitation in respect of time on processing of an overload of the apparatus 1 in regard to an increased power or an increased current which is greater than the nominal current, in the same manner as with the restricted feed of clock-controlled signals, within the feed times (FIGS. 3 and 4). The same concept is applied for handling an overload mode of operation of the apparatus 1 as is set forth in FIGS. 3 and 4 in connection with the use of clock-controlled output signals for the feed of power to the load L.

In that respect more specifically powers which are higher than the nominal power are fed to the load L in conjunction with the nominal current within the feed times $\Delta tx1$ to $\Delta tx4$ (FIG. 4). With the time limitation on permitting an overload (that is to say an overcurrent greater than the nominal current) it is possible to avoid excessive generation of heat in for example the power semiconductors and/or the electrolytic capacitors. In that connection for the second temperature range involving the elevated temperature greater than for example 110° C., it is possible to determine a second (limited) parameter set in respect of corresponding tolerances for the power and the current which are to be fed to the load. Those tolerances in which a possible overcurrent or a possible overload (total power to be fed to the load L) can range are thus kept lower in comparison with the permissible tolerances when the situation involves the first temperature range at a temperature of less than or equal to 110° C. In that case the temperature of about 110° C. can be considered as a limit temperature between the stated temperature ranges and corresponds to the first excessive temperature.

Thus in FIGS. 3 and 4, instead of the possibility of feeding clock-controlled signals during the feed times Δtx1 to Δtx4, it is possible to permit the time-limited feed of an overcurrent greater than the nominal current. This can also be related to the clock control of signals in that time and there is the possible option of setting the feed times as shown in FIGS. 3 and 4 appropriately shorter in regard to the requirement for clock control of the output signals of the apparatus 1, than they are to be set when the relevant components of the apparatus are each to be completely switched through, with a situation involving an increased current greater than the nominal current.

In this case also, in connection with the above-specified alternative control for the situations involving the occurrence of an overload in the apparatus 1 as a consequence of faulty or difficult operating conditions for the load it is advantageously possible to use smaller components in the apparatus 1 as the thermal loading is limited in respect of the respective time duration in accordance with the time concept set forth in FIGS. 3 and 4. It is possible in particular to define various parameter sets, for example in regard to corresponding tolerances for an overload or an excessive amount of power (overload condition) for the respective temperature ranges higher than or lower than 110° C.

Thus the first safety function includes permitting the feed of an excessive power or an overcurrent to the load L in the first temperature range ≤110° C. during a longer period of time, and the second safety function includes permitting the feed of an excessive amount of power or an overcurrent to the load L at times in the second temperature range of greater than 110° C., in which case the feed of the excessive values of current or power occurs within the feed times shown in the Figures. Cumulation of the corresponding times, as was described in relation to FIG. 4, is also possible with the overload signals. The feed of excessive values of current or power can if necessary also be effected in conjunction with signals which are clock-controlled in a predetermined fashion.

The present invention was described by means of embodiments by way of example in conjunction with the related Figures. It is however self-evident to the man skilled and active in this art that the configuration of the present invention in accordance with the described Figures and the references used for the respective parts and components in the Figures and in the description as well as the details given by way of example are not to be interpreted restrictively. The invention is therefore not restricted to the illustrated views and in particular not to the dimensions and shapes.

What is claimed is:

1. A method of controlling a power feed to a load, wherein the load can be connected to an apparatus for the power feed and the power fed to the load has clock-controlled signals, comprising the steps of:
    detecting a temperature prevailing in the apparatus by at least one temperature sensor,
    providing a first safety function if the detected temperature is not greater than a predetermined first excessive temperature,
    providing a second safety function if the detected temperature is greater than the predetermined first excessive temperature, and
    again providing the first safety function if the detected temperature falls and reaches the first excessive temperature, wherein
    the first safety function includes constant cyclic clock control of the power fed to the load and the second safety function includes temporary cyclic clock control of the power fed to the load.

2. The method according to claim 1, wherein the second safety function allows the clock-controlled feed of power to the load during a feed duration which is shorter than a duration during which the temperature is higher than the first excessive temperature.

3. The method according to claim 1, wherein the apparatus includes a circuit board and detection of the prevailing temperature includes detection of the temperature within the apparatus or on the circuit board.

4. The method according to claim 2, wherein the second safety function in the duration during which the detected temperature is higher than the first excessive temperature and outside the feed duration allows a maximum power feed to the load.

5. The method according to claim 2, wherein the second safety function allows a clock control of the power fed to the load at a detected temperature higher than the first excessive temperature only in the feed duration.

6. The method according to claim 4, wherein the second safety function is adapted at successive times with a detected temperature higher than the first excessive temperature to change the respective feed duration in dependence on a respective intermediate duration, in respect of duration.

7. The method according to claim 6, wherein the second safety function is adapted at successive times with a detected temperature higher than the first excessive temperature to set the feed duration shorter than the respective preceding feed duration if the intermediate duration relative to the preceding duration at a temperature higher than the first excessive temperature is less than a predetermined threshold value.

8. The method according to claim 6, wherein the second safety function is adapted at successive times with a detected temperature greater than the first excessive temperature to set the subsequent feed duration longer than the previous feed duration if the interposed duration is greater than a predetermined further threshold value.

9. The method according to claim 2, wherein the second safety function at successive times with a detected temperature greater than the first excessive temperature sums the respective successive feed times and prevents clock control of the power fed to the load during the subsequent feed times during a duration involving the action of a detected temperature higher than the first excessive temperature if the sum of the feed times reaches a maximum value.

10. An apparatus for controlling a power feed to a load which can be connected to the apparatus and the power fed to the load has clock-controlled signals, wherein the apparatus comprises:
    a functional part for the controlled feed of the power to the load,
    at least one temperature sensor for detecting the temperature of the apparatus, and
    a control device for controlling the operation of the apparatus and for carrying out the following actions:
    detecting a temperature prevailing in the apparatus by the at least one temperature sensor, providing a first safety function if the detected temperature is not greater than a predetermined first excessive temperature, providing a second safety function if the detected temperature is greater than the predetermined first excessive temperature, and again providing the first safety function if the detected temperature falls and reaches the first excessive temperature, wherein the first safety function includes constant cyclic clock control of the power fed to the load and the second safety function includes temporary cyclic clock control of the power fed to the load.

11. A method of controlling a power feed to a load, wherein the load can be connected to an apparatus for the power feed and the apparatus can be operated in an overload condition with the power feed to the load, comprising the steps of:

detecting a temperature prevailing in the apparatus by at least one temperature sensor, providing a first safety function if the detected temperature is not greater than a predetermined first excessive temperature, providing a second safety function if the detected temperature is greater than the predetermined first excessive temperature, and again providing the first safety function if the detected temperature falls and reaches the first excessive temperature, wherein the first safety function allows the overload condition of the apparatus with the feed of a power to the load and the second safety function temporarily allows the overload condition of the apparatus with the feed of the power to the load.

* * * * *